United States Patent

Kanda et al.

Patent Number: 5,861,232
Date of Patent: Jan. 19, 1999

[54] WATER-DEVELOPING PHOTOSENSITIVE RESIN COMPOSITION

[75] Inventors: Kazunori Kanda, Yao; Koichi Ueda, Neyagawa; Tadahiro Kakiuchi, Kawanishi; Hisaichi Muramoto, Kobe; Katsuo Koshimura; Kenji Yasuda, both of Yokkaichi; Hozumi Sato, Tsukuba; Takashi Nishioka, Yokkaichi, all of Japan

[73] Assignees: Nippon Paint Co., Ltd., Osaka-fu; Japan Synthetic Rubber Co., Ltd., Tokyo-to, both of Japan

[21] Appl. No.: 657,612

[22] Filed: May 31, 1996

[30] Foreign Application Priority Data

Jun. 2, 1995 [JP] Japan .................... 7-136551

[51] Int. Cl.$^6$ .................... G03F 7/033
[52] U.S. Cl. .................... 430/281.1; 430/287.1; 430/910; 430/907; 522/116; 522/110; 522/121
[58] Field of Search .................... 430/281.1, 287.1, 430/910, 907; 522/116, 110, 121

[56] References Cited

U.S. PATENT DOCUMENTS

| | | | |
|---|---|---|---|
| 4,916,254 | 4/1990 | Watanabe et al. | 560/185 |
| 5,073,477 | 12/1991 | Kusuda et al. | 430/287.1 |
| 5,175,076 | 12/1992 | Ishikawa et al. | 430/910 X |
| 5,344,744 | 9/1994 | Ueda et al. | 430/287.1 |
| 5,476,752 | 12/1995 | Noguchi et al. | 430/287.1 |

FOREIGN PATENT DOCUMENTS

| | | | |
|---|---|---|---|
| B12170 | 10/1992 | Australia | 430/281 |
| 0607962 | 7/1994 | European Pat. Off. . | |
| 61-95349 | 5/1986 | Japan . | |
| 61-181811 | 8/1986 | Japan . | |
| 3-153750 | 7/1991 | Japan | 430/281 |

OTHER PUBLICATIONS

Grant et al, *Grant&Hackh's Chemical Dictionary*, fifth ed. McGraw–Hill Book Company, New York, NY 1987, p. 309.
*Database WPI*, Section Ch, Week 8934, Derwent Publiations Ltd., London, GB; Class A89, AN 89–245523, XP002012658 & JP–A–01 179 146 (Tokyo Oka Kogyo KK), Jul. 17, 1989 *abstract*.

*Primary Examiner*—Cynthia Hamilton
*Attorney, Agent, or Firm*—Wenderoth, Lind & Ponack, L.L.P.

[57] ABSTRACT

The present invention provides a photosensitive resin composition which is superior in water-developing properties, resilience, strength of resin plate after exposure, elongation at break, and transparency of resin plate. The composition comprises:

(1) a particulate copolymer obtained by polymerizing a monomer mixture comprising:
  (a) an aliphatic conjugated diene monomer,
  (b) a monomer represented by the following general formula (I):

$$CH_2=C-C-O-(CH_2)_n-O-(C-R^2O)_m-H \quad (I)$$
$$\phantom{CH_2=C}|\phantom{-C}\|\phantom{-O-(CH_2)_n-O-(}\|$$
$$\phantom{CH_2=C}R^1\phantom{-}O\phantom{-O-(CH_2)_n-O-(}O$$

and
  (c) a monomer having at least two groups capable of addition-polymerizing;
(2) a photopolymerizable unsaturated monomer;
(3) an amino group-containing compound; and
(4) a photopolymerization initiator.

10 Claims, No Drawings

WATER-DEVELOPING PHOTOSENSITIVE RESIN COMPOSITION

BACKGROUND OF THE INVENTION

1. Field of the Invention

The present invention relates to a photosensitive resin composition. More particularly, the present invention relates to a photosensitive resin composition (particularly, photosensitive resin composition for flexographic printing) which can be developed with water, and at the time of development, the composition has small swell characteristics with water and small decrease in strength, is superior in resilience in spite of small change in dimension, and is superior in printability.

2. Description of the Prior Art

Various photosensitive resin compositions have been used in the fields of photoresist, printing ink, plate-making, etc.

As such a photosensitive resin composition, there have been known compositions containing a cyclized rubber and a bisazide compound; compositions containing a thermoplastic elastomer, an acrylic monomer and a photopolymerization initiator; and compositions mainly containing a photosensitive resin (e.g. polyester acrylate, epoxy acrylate, vinyl polycinnamate, chloromethylated polystyrene, aromatic azide group-containing resin, etc.). However, these photosensitive resin compositions are not water-soluble and an organic solvent is exclusively used at the time of developing. However, an influence of the organic solvent on the environment has recently become a serious problem, in addition to safety at the time of operating and about health hazards.

Therefore, a photosensitive resin composition capable of alkaline developing, comprising a novolak resin or poly (vinyl phenol) and a quinone diazide compound, is known to solve the above various problems, but a photosensitive resin composition capable of water developing, which is more safe and simple, is desired.

As the water-developing photosensitive resin composition, for example, there are suggested a composition comprising a water-soluble resin as a main component, such as a composition comprising a water-soluble resin (e.g. polyvinyl alcohol, gelatin, casein, etc.), bichromate salt and diazonium salt or bisazide compound, and a composition comprising a water-soluble resin, a water-soluble acrylic monomer and a photopolymerization initiator, etc.

However, regarding a conventional water-developing photosensitive resin composition, the hydrophilic nature of the resin as the main component in water is remarkable. Therefore, the resin composition swells at the time of developing to cause a decrease in strength and a change in dimension. As a result, the dimensional accuracy of the resist, printing durability of the printing plate (plate wear) and printing quality are deteriorated.

In order to solve the problem of these water-developing photosensitive resin compositions, there is suggested a photosensitive resin composition obtained by formulating a photopolymerizable unsaturated monomer, an amino group-containing compound and a photopolymerization initiator with a copolymer comprising a conjugated diene compound or an acrylic ester compound, an α, β-ethylenic unsaturated carboxylic acid and a polyfunctional vinyl compound, said copolymer being soluble in an aqueous alkaline solution (e.g. Japanese Laid-Open Patent Publication Nos. Sho 60-179411, Sho 60-219208 and Sho 61-181811).

In addition, as another water-developing photosensitive resin composition, a composition comprising a partially crosslinked copolymer of an aliphatic conjugated diene, an α, β-ethylenically unsaturated carboxylic acid and a polyfunctional vinyl compound, an aliphatic conjugated diene copolymer having a molecular weight of not less than 5,000, a photopolymerizable unsaturated monomer, a basic nitrogen atom-containing compound and a photopolymerization initiator (e.g. Japanese Laid-Open Patent Publication No. Hei 1-300246, etc.); a composition comprising a polymer having a tertiary amino group and a polymerizable unsaturated group, an α, β-ethylenicunsaturated monomer having a free acid group, a photopolymerizable unsaturated monomer and a photopolymerization initiator (e.g. Japanese Laid-Open Patent Publication No. Sho 61-246742, etc.); and a composition comprising a photopolymerizable unsaturated monomer, an amino group-containing compound (a part of the photopolymerizable unsaturated monomer or amino group-containing compound has a (meth)acryloyl group) and an aromatic ketone and, optionally, an additional polymer (e.g. Japanese Laid-Open Patent Publication No. Sho 61-228002, etc.) are known.

However, these photosensitive resin compositions are not satisfactory in balance between characteristics such as water-developing properties, flexibility after photosetting and developing, resilience, hardness of rubber, mechanical strength, etc.

SUMMARY OF THE INVENTION

An object of the present invention is to provide a water-developable photosensitive resin composition which is superior in water-developing properties and causes small decrease in strength and small change in dimension because of small swelling at the time of water developing, and which is superior in mechanical strength after exposure, elongation at break, resilience and balance between those characteristics.

The present invention relates to a water-developable photosensitive resin composition, comprising:

(1) a particulate copolymer obtained by polymerizing a monomer mixture containing:
  (a) 10 to 95 molar % of an aliphatic conjugated diene monomer,
  (b) 0.1 to 30 molar % of a monomer represented by the following general formula (I):

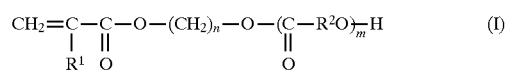

wherein $R^1$ is a hydrogen atom or a methyl group, $R^2$ is an alkylene group having 3 to 20 carbon atoms, n is an integer of 2 to 6, and m is an integer of 1 to 20,
  (c) 0.1 to 30 molar % of a monomer having an ionic hydrophilic group, and
  (d) 0.1 to 20 molar % of a monomer having at least two groups capable of addition-polymerizing the total amount of components (a), (b), (c) and (d) being 100 molar %;

(2) a photopolymerizable unsaturated monomer;

(3) an amino group-containing compound; and (4) a photopolymerization initiator.

DETAILED DESCRIPTION OF THE INVENTION

The present invention relates to a water-developable photosensitive resin composition, comprising:

(1) a particulate copolymer obtained by polymerizing a monomer mixture containing:

(a) 10 to 95 molar % of an aliphatic conjugated diene monomer, (b) 0.1 to 30 molar % of a monomer represented by the following general formula (I):

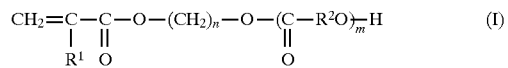

wherein $R^1$ is a hydrogen atom or a methyl group, $R^2$ is an alkylene group having 3 to 20 carbon atoms, n is an integer of 2 to 6, and m is an integer of 1 to 20, (c) 0.1 to 30 molar % of a monomer having an ionic hydrophilic group, and (d) 0.1 to 20 molar % of a monomer having at least two groups capable of addition-polymerizing, total amount of components (a), (b), (c) and (d) being 100 molar %;

(2) a photopolymerizable unsaturated monomer;

(3) an amino group-containing compound; and (4) a photopolymerization initiator.

The particulate copolymer (1) (hereinafter merely referred to as a "copolymer (1)", sometimes), which is one of the components constituting the water-developable photosensitive resin composition in the present invention, comprises the components (a), (b), (c) and (d) as the essential components, and it may optionally contain a copolymerizable monomer component (e) other than those components.

The monomer component (a) constituting the copolymer (1) has a function of imparting properties of the elastomer (e.g. strength, elongation, resilience, etc. of the composition) after the completion of the photosetting reaction. The monomer component (a) may be exemplified by butadiene, isoprene, 1,3-pentadiene, 1,3-hexadiene, 2,3-dimethylbutadiene, 4,5-diethyl-1,3-octadiene, 3-butyl-1,3-octadiene, chloroprene, 2,3-dichlorobutadiene, 1,3-cyclopentadiene and a mixture thereof. Among them, butadiene and isoprene are preferred in view of the mechanical strength and resilience, and butadiene is particularly preferred.

The amount of the monomer component (a) constituting the copolymer (1) is 10 to 95 molar %, preferably 30 to 90 molar %, based on the total monomer components constituting the copolymer (1). When the amount of the monomer component (a) is less than 10 molar %, the strength of the composition polymer after photosetting becomes low. On the other hand, when the amount exceeds 95 molar %, the resulting photosensitive resin composition is inferior in water-developing properties.

The monomer component (b) constituting the copolymer (1) has the general formula (I):

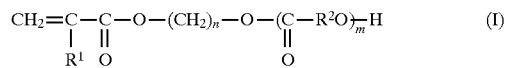

wherein $R^1$ is a hydrogen atom or a methyl group, $R^2$ is an alkylene group having 3 to 20 carbon atoms, n is an integer of 2 to 6, and m is an integer of 1 to 20. This monomer component contributes to impart water-developing properties to the resin composition and to improve performances of the printing plate, particularly resilience.

Examples of the compound represented by the general formula (I) include the following compounds. They can be used alone or in combination thereof.

$CH_2=CHCOOC_2H_4O-CO-C_3H_6OH$, $CH_2=CHCOOC_2H_4O-COC_4H_8OH$, $CH_2=CHCOOC_2H_4O-CO-C_5H_{10}OH$, $CH_2=CHCOOC_2H_4O-(CO-C_3H_6O)_2H$, $CH_2=CHCOOC_2H_4O-(COC_4H_8O)_2H$, $CH_2=CHCOOC_2H_4O-(CO-C_5H_{10}O)_2H$, $CH_2=CHCOOC_2H_4O-(CO-C_5H_{10}O)_3H$, $CH_2=CHCOOC_2H_4O-(CO-C_5H_{10}O)_4H$, $CH_2=CHCOOC_2H_4O-(CO-C_5H_{10}O)_5H$, $CH_2=CHCOOC_3H_6O-CO-C_5H_{10}OH$, $CH_2=CHCOOC_3H_6O-(COC_5H_{10}O)_2-H$, $CH_2=CHCOOC_3H_6O-(COC_5H_{10}O)_5-H$, $CH_2=CHCOOC_4H_8O-COC_5H_{10}OH$, $CH_2=CHCOOC_4H_8O-(COC_5H_{10}O)_5-H$, $CH_2=C(CH_3)COOC_2H_4O-CO-C_3H_6OH$, $CH_2=C(CH_3)COOC_2H_4O-COC_4H_8OH$, $CH_2=C(CH_3)COOC_2H_4O-CO-C_5H_{10}OH$, $CH_2=C(CH_3)COOC_2H_4O-(CO-C_3H_6O)_2H$, $CH_2=C(CH_3)COOC_2H_4O-(COC_4H_8O)_2H$, $CH_2=C(CH_3)COOC_2H_4O-(CO-C_5H_{10}O)_2H$, $CH_2=C(CH_3)COOC_2H_4O-(CO-C_5H_{10}O)_3H$, $CH_2=C(CH_3)COOC_2H_4O-(CO-C_5H_{10}O)_4H$, $CH_2=C(CH_3)COOC_2H_4O-(CO-C_5H_{10}O)_5H$, $CH_2=C(CH_3)COOC_3H_6O-CO-C_5H_{10}OH$, $CH_2=C(CH_3)COOC_3H_6O-(COC_5H_{10}O)_2-H$, $CH_2=C(CH_3)COOC_3H_6O-(COC_5H_{10}O)_5H$, $CH_2=C(CH_3)COOC_4H_8O-COC_5H_{10}OH$ and $CH_2=C(CH_3)COOC_4H_8O-(COC_5H_{10}O)_5-H$. Among them, those represented by the general formula (I) wherein $R^2$ is an alkylene group having 3 to 7 carbon atoms, n is an integer of 2 to 4 and m is an integer of 1 to 5 are preferred. Among them, ε-caprolactone-modified hydroxyethyl (meth)acrylate represented by the general formula (I), wherein $R^1$ is H or $CH_3$, $R^2$ is $C_5H_{10}$, n is 2 and m is an integer of 1 to 4, is particularly preferred.

The amount of the monomer component (b) constituting the copolymer (1) is 0.1 to 30 molar %, preferably 0.5 to 25 molar %, more preferably 5 to 20 molar %, based on the total monomer components constituting the copolymer (1). When the amount of the monomer component (b) is less than 0.1 molar %, the water-developing properties of the resulting resin composition become insufficient. On the other hand, when the amount exceeds 30 molar %, the solid retention of the resin composition is deteriorated and resilience of the printing plate material after photosetting is deteriorated. In addition, the printing plate material becomes hard and brittle.

The monomer component (c) constituting the copolymer (1) imparts the water-developing properties to the composition, and improves the storage stability of the composition before and after photo-exposure. The monomer component (c) can be used alone or in combination thereof according to the purpose thereof.

The ionic hydrophilic group of the above compounds means a group in the molecule, which can easily bond with water molecule, and examples thereof include a carboxyl group, a phosphoric group, a phosphate group, a sulfonic group, etc. In the present invention, however, the ionic hydrophilic group is not limited to them. Examples of the compound thereof include α, β-ethylenic unsaturated carboxylic acids such as (meth)acrylic acid (including methacrylic acid and acrylic acid, the same as in the following), etc.; unsaturated (mono)carboxylic acids (including monocarboxylic acid and polycarboxylic acid, the same as in the following) such as crotonic acid, cinnamic acid, etc.; unsaturated polycarboxylic acids such as (anhydrous) maleic acid (including anhydrous maleic acid and maleic acid, the same as or the following), fumaric acid, (anhydrous) itaconic acid, citraconic acid, mesaconic acid, etc.; free carboxyl group containing esters such as monomethyl ester, monoethyl ester, monopropyl ester, monohexyl ester, monooctyl ester, dimethyl ester, diethyl ester, dipropyl ester and dibutyl ester of the above unsaturated polycarboxylic acid, etc.; free carboxyl group-containing nitriles such as mononitrile of the above unsaturated polycarboxylic acid, etc.; free carboxyl group-containing esters such as monoester of non-polymerizable polycarboxylic acid (e.g. phthalic acid, succinic acid, adipic acid, etc.) and hydroxyl group-containing unsaturated compound (e.g. allyl alcohol, 2-hydroxyethyl (meth)acrylate, etc.); and compounds represented by the general formula (II):

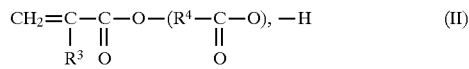

In the above formula, $R^3$ is a hydrogen atom or a methyl group; $R^4$ is an alkylene group having 3 to 20 carbon atoms, preferably 3 to 10 carbon atoms, such as propylene group, butylene group, etc.; and l is an integer of 1 to 20, preferably 1 to 10.

Examples of the compound represented by the general formula (II) include $CH_2=CHCOO-C_3H_6COOH$, $CH_2=CHCOO-C_4H_8COOH$, $CH_2=CHCOO-C_5H_{10}COOH$, $CH_2=CHCOO-(C_3H_6COO)_2-H$, $CH_2=CHCOO-(C_4H_8COO)_2-H$, $CH_2=CHCOO-(C_5H_{10}COO)_2-H$, $CH_2=CHCOO-(C_5H_{10}COO)_3-H$, $CH_2=CHCOO-(C_5H_{10}COO)_4-H$, $CH_2=CHCOO-(C_5H_{10}COO)_5-H$, $CH_2=C(CH_3)COO-C_3H_6COOH$, $CH_2=C(CH_3)COO-C_4H_8COOH$, $CH_2=C(CH_3)COO-C_5H_{10}COOH$, $CH_2=C(CH_3)COO-(C_3H_6COO)_2-H$, $CH_2=C(CH_3)COO-(C_4H_8COO)_2-H$, $CH_2=C(CH_3)COO-(C_5H_{10}COO)_2-H$, $CH_2=C(CH_3)COO-(C_5H_{10}COO)_3-H$, $CH_2=C(CH_3)COO-(C_5H_{10}COO)_4-H$, $CH_2=C(CH_3)COO-(C_5H_{10}COO)_5-H$, etc. Furthermore, examples thereof include vinylsulfonic acid, styrene-p-sulfonic acid, 2-acrylamide-2-methylpropanesulfonic acid, 2-amidophosphoxyethyl methacrylate, ethylene (meth)acrylate phosphate, tetramethylene (meth)acrylate phosphate, (bis)ethylene (meth)acrylate phosphate, (bis)tetramethylene (meth)acrylate phosphate, diethylene glycol (meth)acrylate phosphate, (bis)diethylene glycol (meth)acrylate phosphate, triethylene glycol (meth)acrylate phosphate, etc.

Among the monomer component (c), acrylic acid and methacrylic acid are preferred, and those represented by the general formula (II) wherein $R^4$ is an alkylene group having 3 to 7 carbon atoms and l is an integer of 1 to 5 are more preferred. In view of the water-developing properties and elastic modulus, ε-caprolactone-modified carboxylic monomer represented by the general formula (II), wherein $R^3$ is H or $CH_3$, $R^4$ is $C_5H_{10}$ and l is an integer of 1 to 4, is particularly preferred.

The amount of the monomer component (c) is 0.1 to 30 molar %, preferably 0.5 to 20 molar %, more preferably 1 to 10 molar %, based on the total monomer components constituting the copolymer (1). When the amount of the monomer component (c) is less than 0.1 molar %, the water-developing properties of the resulting resin composition become insufficient. On the other hand, when the amount exceeds 30 molar %, the solid retention of the resin composition is deteriorated and resilience of the composition after photosetting is deteriorated. In addition, the photoset composition becomes hard and brittle.

The monomer component (d) constituting the copolymer (1) plays the role in expressing the water-developing properties of the composition containing the copolymer. For example, there can be used ethylene glycol di(meth)acrylate, trimethylolpropane di(meth)acrylate, trimethylolpropane tri(meth)acrylate, propylene glycol dimethacrylate, propylene glycol diacrylate, divinylbenzene, trivinylbenzene, pentaerythritol tri(meth)acrylate, pentaerythritol tetra(meth)acrylate, 1,4-butanediol di(meth)acrylate, 1,6-hexanediol di(meth)acrylate, etc. These polyfunctional polymerizable monomers may be used alone or in combination thereof.

Among them, divinylbenzene and ethylene glycol di(meth)acrylate are particularly preferred in view of the transparency, mechanical strength and water-developing properties of the resin composition.

The amount of the monomer component (d) is 0.1 to 20 molar %, preferably 0.5 to 10 molar %. When the amount of the monomer component (d) is less than 0.1 molar %, the water-developing properties of the composition are inferior. On the other hand, when the amount exceeds 20 molar %, the compatibility between the particulate polymer and photopolymerizable monomer is inferior and, therefore, the processability becomes inferior. Furthermore, a decrease in strength of the polymer composition after photosetting is remarkable.

The monomer component (e), which is optionally added, is mainly added so as to improve the processability, plate wear (printing durability), organic solvent-resistance, ink resistance and printability of the resin composition, and it may be any compound having one addition-polymerizable group. Examples thereof include 2-hydroxyethyl acrylate, hydroxypropyl acrylate, 2-hydroxyethyl methacrylate, hydroxypropyl methacrylate, hydroxybutyl acrylate, hydroxybutyl methacrylate, allyl alcohol, methallyl alcohol, N-(4-hydroxyphenyl)acrylamide or N-(4-hydroxyphenyl) methacrylamide, o-, m- or p-hydroxystyrene, o-, m- or p-hydroxyphenyl-acrylate or o-, m- or p-hydroxyphenyl-methacrylate, and other hydroxy group-containing monomers; alkyl acrylates or methacrylates, such as methyl (meth)acrylate, ethyl (meth)acrylate, n-butyl (meth)acrylate, propyl (meth)acrylate, acyl (meth)acrylate, cyclohexyl (meth)acrylate, octyl acrylate, 2-chloroethyl acrylate, etc.; polymerizable amides such as acrylamide, methacrylamide, N-methylolacrylamide, N-methylolmethacrylamide, N-ethylacrylamide, N-hexylacrylamide, N-cyclohexylacrylamide, N-hydroxyethylacrylamide, N-phenylacrylamide, N-nitrophenylacrylamide, N-ethyl-N-phenylacrylamide, etc.; nitrogen-containing alkyl acrylates or methacrylates, such as dimethylaminoethyl acrylate, dimethylaminoethyl methacrylate, etc.; vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, etc.; vinyl esters such as vinyl acetate, vinyl chloroacetate, vinyl butyrate, vinyl benzoate, etc.; styrenes such as styrene, a-methylstyrene, methylstyrene, chloromethylstyrene, etc.; vinyl ketones such as methyl vinyl ketone, ethyl vinyl ketone, propyl vinyl ketone, phenyl vinyl ketone, etc.; olefines such as ethylene, propylene, isobutylene, glycidyl (meth)acrylate, etc.; polymerizable nitriles such as acrylonitrile, methacrylonitrile, N-vinylpyrrolidone, N-vinylcarbazole, 4-vinylpyridine, etc. These compounds may be used alone or in combination thereof.

The monomer component (e) is contained in an amount of not more than 70 molar %, preferably 1 to 40 molar %, based on the total monomer components. When the amount the monomer component (e) exceeds 70 molar %, problems such as decrease in rubber elasticity and mechanical strength of the composition, deterioration of water-developing properties, deterioration of stability of the composition, deterioration of transparency of the composition, etc. arise.

Among them, methyl (meth)acrylate, ethyl (meth)acrylate, styrene, acrylonitrile and 2-ethylhexyl (meth)acrylate are particularly preferred in view of the rubber elasticity, mechanical strength, solvent resistance, processability of the composition, plate wear (printing durability), etc.

The copolymer (1) is prepared as the particulate copolymer by an emulsion polymerization or suspension polymerization process using a radical initiator. It is, however, preferred to use the emulsion polymerization process in view of the size of particles and uniformity of the particle size. The polymerization agent such as each monomer, radical initiator, etc. may be added in one portion at the time of the beginning of the reaction, or optionally added in several portions after the beginning of the reaction. The polymerization is conducted at 0° to 80° C. in a reactor containing no oxygen, and the operation conditions (e.g. temperature, stirring, etc.) can be optionally changed during the reaction. As polymerization system, both continuous and batch systems can be used.

As the radical initiator, for example, organic peroxides (e.g. benzoyl peroxide, cumene hydroperoxide, paramentane hydroperoxide, lauroyl peroxide, etc.), diazo compounds (e.g. azobisisobutyronitrile, etc.), inorganic compounds (e.g. potassium persulfate, etc.) and redox catalysts (e.g. combination of organic compound and iron sulfate, etc.) are used.

It is preferred that the copolymer (1) is in the particulate form. The average particle size of particles is adjusted within the range of 5 to 800 nm, preferably 10 to 300 nm, more preferably 30 to 200 nm. When the particle size of the particles is larger than 800 nm, the print-making properties in the production of the resin plate and the strength is lowered. On the other hand, when the particle size is smaller than 5 nm, the rubber elasticity of the resulting composition is low and the water-developing properties are inferior. The water resistance and water-developing properties of the water-developable photosensitive resin composition are further improved by hydrophilizing the surface of the particles of the particulate polymer and imparting a hydrophobicity to the interior of the particles.

Examples of the photopolymerizable unsaturated monomer (2) as one of the constituent components of the present invention include aromatic vinyl compounds such as styrene, α-methylstyrene, o-methylstyrene, p-methylstyrene, p-t-butylstyrene, o-methoxystyrene, m-methoxystyrene, p-methoxystyrene, diisopropenylbenzene, divinylbenzene, o-chlorostyrene, m-chlorostyrene, p-chlorostyrene, N,N-dimethyl-p-aminostyrene, N,N-diethyl-p-aminostyrene, vinylpydridine, etc.;

unsaturated nitrile compounds such as (meth)acrylonitrile (representing acrylonitrile and methacrylonitrile, the same as in the following), α-chloroacrylonitrile, α-chloromethylacrylonitrile, α-methoxyacrylonitrile, α-ethoxyacrylonitrile, nitrile crotonate, nitrile cinnamate, nitrile itaconate, dinitrile maleate, dinitrile fumarate, etc.;

alkyl (meth)acrylates such as methyl (meth)acrylate, ethyl (meth)acrylate, n-propyl (meth)acrylate, isopropyl (meth) acrylate, n-butyl (meth)acrylate, isobutyl (meth)acrylate, sec-butyl (meth)acrylate, tert-butyl (meth)acrylate, n-amyl (meth)acrylate, 2-ethylhexyl (meth)acrylate, n-octyl (meth) acrylate, lauryl (meth)acrylate, stearyl (meth)acrylate, etc.;

unsaturated monocarboxylates such as methyl crotonate, ethyl crotonate, propyl crotonate, butyl crotonate, methyl cinnamate, ethyl cinnamate, propyl cinnamate, butyl cinnamate, etc.;

fluoroalkyl (meth)acrylates such as trifluoroethyl (meth) acrylate, pentafluoropropyl (meth)acrylate, heptafluorobutyl (meth)acrylate, etc.;

mono- or di-(meth)acrylates of alkylene glycols, such as ethylene glycol, 1,2-propanediol, 1,3-propanediol, 1,4-butanediol, 1,5-pentanediol, 1,6-hexanediol, etc.;

mono- or di-(meth)acrylates of polyalkylene glycol (2 to 23 alkylene glycol monomers), such as polyethylene glycol, polypropylene glycol, etc.;

alkoxyalkyl (meth)acrylates such as 2-methoxyethyl (meth)acrylate, 2-ethoxyethyl (meth)acrylate, 2-methoxypropyl (meth)acrylate, 2-ethoxypropyl (meth) acrylate, 3-methoxypropyl (meth)acrylate, 3-ethoxypropyl (meth)acrylate, etc.;

(meth)acrylates of alkoxyalkylene glycol or alkoxypolyalkylene glycol (e.g. number of alkylene glycol unit: 2 to 23), such as methoxyethylene glycol, methoxypropylene glycol, methoxypolyethylene glycol, ethoxypolyethylene glycol, methoxypolypropylene glycol, ethoxypolypropylene glycol, etc.;

aryloxyalkyl (meth)acrylates such as 2-phenoxyethyl (meth)acrylate, 2-phenoxypropyl (meth)acrylate, 3-phenoxypropyl (meth)acrylate, etc.;

mono(meth)acrylates of aryloxypolyalkylene glycol, such as phenoxypolyethylene glycol, phenoxypolypropylene glycol, etc.;

cyanoalkyl (meth)acrylates such as cyanoethyl (meth) acrylate, cyanopropyl (meth)acrylate, etc.;

oligo (meth)acrylates such as (meth)acrylate, tri(meth) acrylate, tetra(meth)acrylate, etc. of polyhydric alcohols such as glycerin, 1,2,4-butanetriol, pentaerythritol, trimethylolalkane (e.g. carbon number of alkane is 1 to 3), tetramethylolalkane (e.g. carbon number of alkane is 1 to 3), etc.;

mono- or oligo-(meth)acrylates of polyalkylene glycol adduct of polyhydric (trihydric or more) alcohol;

mono- or di-(meth)acrylates of cyclic polyol such as 1,4-cyclohexanediol, 1,4-benzenediol, 1,4-dihydroxyethylbenzene, etc.;

hydroxyalkyl (meth)acrylates such as 2-hydroxyethyl (meth)acrylate, 2-hydroxypropyl (meth)acrylate, 3-hydroxypropyl (meth)acrylate, 3-chloro-2-hydroxypropyl (meth)acrylate, 2-hydroxybutyl (meth)acrylate, 3-hydroxybutyl (meth)acrylate, 4-hydroxybutyl (meth) acrylate, etc.;

mono(meth)acrylates of (poly)alkylene glycol, such as glycerol mono(meth)acrylate, polyethylene glycol mono (meth)acrylate (e.g. number of polyethylene glycol unit: 2 to 20), polypropylene glycol mono(meth)acrylate (e.g. number of polypropylene glycol unit: 2 to 20), etc.;

free hydroxyl group-containing (meth)acrylates of polyhydric alcohol (trihydric or more), such as glycerol di(meth) acrylate, 1,2,4-butanetriol mono(meth)acrylate, 1,2,4-butanetriol di(meth)acrylate, trimethylolalkane mono(meth) acrylate (e.g. number of carbon atoms of alkane: 1 to 3), trimethylolalkane di(meth)acrylate (e.g. number of carbon atoms of alkane: 1 to 3), tetramethylolalkane di(meth) acrylate (e.g. number of carbon atoms of alkane: 1 to 3), tetramethylolalkane tri(meth)acrylate (e.g. number of carbon atoms of alkane: 1 to 3), etc.;

hydroxyalkyl esters of the unsaturated carboxylic acid, such as 2-hydroxyethyl crotonate, 2-hydroxypropyl crotonate, 2-hydroxyethyl cinnamate, 2-hydroxypropyl cinnamate, etc.;

hydroxyl group-containing vinyl aromatic compounds such as o-hydroxystyrene, m-hydroxystyrene, p-hydroxystyrene, o-hydroxy-α-methylstyrene, m-hydroxy-α-methylstyrene, p-hydroxy-α-methylstyrene, p-vinylbenzyl alcohol, etc.;

unsaturated alcohols such as (meth)allyl alcohol, etc.;

unsaturated (mono)carboxylic acids such as (meth)acrylic acid, crotonic acid, cinnamic acid, etc.;

unsaturated polycarboxylic acids (anhydrides) such as maleic acid (anhydride), fumaric acid, itaconic acid (anhydride), citraconic acid, mesaconic acid, etc.;

free carboxyl group-containing esters such as monomethyl ester, monoethyl ester, monopropyl ester, monohexyl ester, monooctyl ester, dimethyl ester, diethyl ester, dipropyl ester or dibutyl ester of the above unsaturated polycarboxylic acid;

free carboxyl group-containing nitriles such as mononitrile of the above unsaturated polycarboxylic acid;

free carboxyl group-containing esters such as monoester of non-polymerizable polyhydric carboxylic acid (e.g. phthalic acid, succinic acid, adipic acid, etc.) and hydroxyl group-containing unsaturated compound (e.g. allyl alcohol, 2-hydroxyethyl (meth)acrylate, etc.);

diesters of unsaturated carboxylic acid, such as dimethyl maleate, diethyl maleate, dibutyl maleate, dioctyl maleate, diethyl fumarate, dibutyl fumarate, dioctyl fumarate, dimethyl itaconate, diethyl itaconate, dibutyl itaconate, dioctyl itaconate, etc.;

epoxy group-containing unsaturated compounds such as allyl glycidyl ether,. glycidyl (meth)acrylate, etc.; and vinyl chloride, vinyl acetate, cinnamate, crotonate, dicyclopentadiene, ethylidene norbornene, etc.

The photopolymerizable unsaturated monomer component is used for accomplishing desired physical properties of the photosensitive resin composition after photosetting, e.g. mechanical strength, resilience, ink resistance, printing durability (plate wear), etc.

Among the above photopolymerizable unsaturated monomer components, alkyl (meth)acrylates and alkylene glycol (meth)acrylates are particularly preferred in view of their compatibility with the particulate copolymer (1), the mechanical strength and resilience of the composition.

The photopolymerizable unsaturated monomer (2) can be used in any proportion according to the purpose, and the fluidity can be freely designed in the form of wax or low-viscosity liquid according to the amount. It is, however, used in an amount within the range of 5 to 1000 parts by weight, preferably 10 to 500 parts by weight, based on 100 parts by weight of the copolymer (1). When the amount is less than 5 parts by weight, the strength of the resulting resin composition is inferior. On the other hand, when it exceeds 1000 parts by weight, the amount of shrinkage of the composition after photosetting becomes large. Therefore, it becomes difficult to satisfy both water resistance and water-developing properties of the composition and, at the same time, the design freedom of the composition is lowered.

The amino group-containing compound (3) as one of the constituent components of the present invention functions to impart the water-developing properties to the composition. As the amino group-containing compound (3), for example, organic compounds having one or more primary, secondary or tertiary amino groups can be used. Among them, an organic compound having a tertiary amino group is preferred.

Examples of the primary amine include methylamine, ethylamine, propylamine, butylamine, etc.

Examples of the secondary amine include dimethylamine, methylethylamine, diethylamine, methylpropylamine, ethylpropylamine, dipropylamine, dibutylamine, etc.

Examples of the tertiary amine include trialkylamines such as trimethylamine, methyldiethylamine, diethylethylamine, triethylamine, dimethylpropylamine, methylethylpropylamine, diethylpropylamine, methyldipropylamine, ethyldipropylamine, tripropylamine, dimethylbutylamine, methyldibutylamine, methylethylbutylamine, diethylbutylamine, ethyldibutylamine, methylpropylbutylamine, ethylpropylbutylamine, dipropylbutylamine, propyldibutylamine, tributylamine, etc.;

alkylalkanol tertiary amines such as dimethylethanolamine, methyldiethanolamine, diethylethanolamine, ethyldiethanolamine, etc.; trialkanolamines such as triethanolamine, diethanolpropanolamine, ethanoldipropanolamine, tripropanolamine, etc.;

N,N-dialkylaminoalkoxyalkanols such as N,N-dimethylaminoethoxyethanol, N,N-diethylaminoethoxyethanol, N,N-dimethylaminoethoxypropanol, N,N-diethylaminoethoxypropanol, etc.;

N,N-dialkylaminoalkyl (meth)acrylates such as N,N-dimethylaminoethyl (meth)acrylate, N,N-diethylaminoethyl (meth)acrylate, N,N-dipropylaminoethyl (meth)acrylate, N,N-dimethylaminopropyl (meth)acrylate, N,N-diethylaminopropyl (meth)acrylate, N,N-dipropylaminopropyl (meth)acrylate, etc.;

N,N-dialkylaminoalkoxyalkyl (meth)acrylates such as N,N-dimethylaminoethoxyethyl (meth)acrylate, N,N-diethylaminoethoxyethyl (meth)acrylate, etc.;

tertiary amino group-containing (meth)acrylamides such as N-(N',N'-dimethylaminoethyl)(meth)acrylamide, N-(N',N'-diethylaminoethyl)(meth)acrylamide, N-(N',N'-dimethylaminopropyl)(meth)acrylamide, N-(N',N'-diethylaminopropyl)(meth)acrylamide, etc.; and tertiary amino group-containing carbamates such as N,N-dimethylaminoethyl-N'-(meth)acryloyl carbamate, N,N-diethylaminoethyl-N'-(meth)acryloyl carbamate, etc.

It is preferred to use a tertiary amine for having excellent water-developing properties among the above amino group-containing compounds. It is more preferred to use tertiary amine group-containing compounds having an α, β-ethylenic unsaturated group, such as tertiary amino group-containing (meth)acrylates, tertiary amino group-containing (meth)acrylamides, etc. in view of the mechanical strength of the composition after photosetting.

The amino group-containing compound (3) of the present invention is used in an amount of 2 to 50 parts by weight, preferably 5 to 40 parts by weight, more preferably 5 to 30 parts by weight, based on 100 parts by weight of the copolymer (1). If the amount is within this range, these amino group-containing compounds can be used alone or in combination thereof according to the purpose. When the amount of the amino group-containing compound (3) is smaller than 2 parts by weight, it is difficult to develop sufficient water-developing properties. On the other hand, even if it is used in the amount of larger than 50 parts by weight, the water-developing properties are not improved. From the viewpoint of neutralization %, the amino group-containing compound (3) is preferably used in the amount within the range of 50 to 200 molar %, more preferably 90 to 150 molar %, for the acid radical equivalent of the copolymer (1).

Examples of the photoinitiator (4) used in the photosensitive resin composition of the present invention include α-diketone compounds such as diacetyl, benzyl, etc.; acyloins such as benzoin, pivaloin, etc.; acyloin ethers such as benzoin methyl ether, benzoin ethyl ether, benzoin propyl ether, etc.; polynuclear quinones such as anthraquinones, 1,4-naphthoquinone, etc.; acetophenones such as 2,2-dimethoxyphenylacetophenone, trichloroacetophenone, etc.; benzophenones such as benzophenone, methyl-o-benzoyl benzoate, etc. Other normal photopolymerization initiators can also be used.

The amount of the photopolymerization initiator (4) is 0.1 to 20 parts by weight, preferably 0.5 to 10 parts by weight, based on 100 parts by weight of the copolymer (1) as one of the constituent components of the photosensitive resin composition of the present invention. When the amount is less than 0.1 part by weight, the photosensitive resin composition can not be sufficiently cured. On the other hand, when the amount exceeds 20 parts by weight, the whole amount of photopolymerization initiator does not take part in the reaction, which is uneconomical. Sometimes, its compatibility with the copolymer (1), photopolymerizable unsaturated monomer (2) and amino group-containing compound (3) is inferior, which results in ununiform dispersion.

The water-developing photosensitive resin composition of the present invention comprises the particulate copolymer (1), photopolymerizable unsaturated monomer (2), amino group-containing compound (3) and photopolymerization initiator (4) as the essential constituent components, but can also contain a block copolymer, if necessary.

The block copolymer comprises a hard segment and a soft segment, wherein the hard segment is a thermoplastic non-elastomeric copolymer block having a glass transition point of not less than 20° C. and the soft segment is an elastomeric copolymer having a glass transition temperature of not more than 10° C.

The hard segment constituting the block copolymer comprises the thermoplastic non-elastomeric polymer block having a glass transition point of not less than 20° C. Preferred examples of the monomer component constituting mainly the polymer block include a vinyl aromatic compound. Examples thereof include styrene, t-butylstyrene, α-methylstyrene, p-methylstyrene, divinylbenzene, 1,1-diphenylstyrene, N,N-dimethyl-p-aminoethylstyrene, N,N-diethyl-p-aminoethylstyrene, vinylpyridine, etc. Among them, styrene and a-methylstyrene are particularly preferred. The hard segment constituting the block copolymer can also be obtained by copolymerizing the above vinyl aromatic compound with conjugated diene compound or other copolymerizable monomer component within the above glass transition temperature range, if necessary.

The soft segment constituting the block copolymer comprises the elastomeric polymer block having a glass transition point of not more than 10° C. Preferred examples of the monomer component constituting mainly the polymer block include a conjugated diene compound. Examples thereof include 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, 3-butyl-1,3-octadiene, chloroprene, etc. Among them, 1,3-butadiene, isoprene and 1,3-pentadiene are preferred so as to obtain a polymer block which can be industrially available and is superior in physical properties, and 1,3-butadiene and isoprene are more preferred. The soft segment constituting the block copolymer can also be obtained by copolymerizing the above conjugated diene compound with the vinyl aromatic compound or other copolymerizable monomer component within the above glass transition 5 temperature range, if necessary.

The amount of the block copolymer can be appropriately selected according to the purpose of use of the composition, but is 0.1 to 100 parts by weight, preferably 1 to 90 parts by weight, more preferably 2 to 70 parts by weight, based on 100 parts by weight of the copolymer (1). When the amount of the block copolymer is less than 0.1 part by weight, the strength of the composition after exposure becomes insufficient, sometimes. On the other hand, when the amount exceeds 100 parts by weight, the water-developing properties of the composition are liable to be deteriorated.

Various additives can be optionally formulated the water-developing photosensitive resin composition of the present invention. Examples of the additive include thermal addition polymerization inhibitor which acts as a storage stabilizer. Examples of the thermal addition polymerization inhibitor include hydroxy aromatic compounds such as hydroquinone, hydroquinone monomethyl ether, mono-t-butylhydroquinone, catechol, p-t-butylcatechol, p-methoxyphenol, 2,6-di-t-butyl-p-cresol, 2,6-di-t-butyl-m-cresol, pyrogallol, β-naphthol, etc.;

quinones such as benzoquinone, 2,5-diphenyl-p-benzoquinone, p-toluquinone, p-xyloquinone, etc.;

nitro compounds such as nitrobenzene, m-dinitrobenzene, 2-methyl-2-nitrosopropane, α-phenyl-t-butylnitrone, 5,5-dimethyl-1-pyrroline-1-oxide, etc.;

amines such as chloranil-amine, diphenylamine, diphenylpicrylhydrazine, phenol-α-naphthylamine, pyridine, phenothiazine, etc.;

sulfides such as dithiobenzoyl sulfide, dibenzyl tetrasulfide, etc.;

unsaturated compounds such as 1,1-diphenylethylene, α-methylthioacrylonitrile, etc.;

thiazine dyes such as thionine blue, toluidine blue, methylene blue, etc.; and stable radicals such as 1,1-diphenyl-2-picrylhydrazyl, 1,3,5-triphenylferdazyl, 4-hydroxy-2,2,6,6-tetramethylpiperidin-1-oxyl, 2,6-di-t-butyl-α-(3,5-di-t-butyl)-4-oxo-2,5-cyclohexadien e-1-ylidene-p-trioxyl, etc.

These thermal addition polymerization inhibitors can be used alone or in combination thereof.

The resin composition of the present invention is obtained, for example, by sufficiently stirring the copolymer (1), photopolymerizable unsaturated monomer (2), amino group-containing compound (3) and photopolymerization initiator (4) with heating, using a kneader, an inter mixer, etc. The photosensitive resin composition thus obtained can be freely designed in the form of wax having no fluidity, rubbery liquid, or slighlty viscous liquid having excellent fluidity.

The photosensitive resin composition having no fluidity can be processed to give a photosensitive plate having a constant film thickness by sandwiching a spacer having a suitable thickness, applying the composition on a substrate by means of a roll coater, or compression molding or extrusion molding. A printing plate can be obtained by putting a negative film on the resulting photosensitive plate, exposing to light and washing the non-exposed area with water.

The viscosity of the photosensitive resin composition having fluidity can also be adjusted by adding a suitable solvent, if necessary. Thereby, it can be used as the resist which is suitable for spin coating. Similarly, a clear image can be formed by washing the non-exposed area after exposure with water.

The exposure is conducted by irradiating light having a polymerization wavelength for the photopolymerizable unsaturated monomer, normally 250 to 500 nm. The dose should be appropriately set so as to satisfy qualities of the image, particularly dot-image reproducibility and etching depth, and is preferably about 100 to 5000 mJ/cm$^2$.

The photosensitive resin composition of the present invention can be used as a photosensitive printing plate (flexographic printing plate) and a resist material, and a photosensitive material in the fields of photoresist, plate-making, etc., extremely suitably. It is also used widely as the photosensitive material in the fields of photosensitive ink, photosensitive paint, photosensitive adhesive, photomolding material, etc.

The photosensitive resin composition of the present invention is superior in water-developing properties, resilience, strength of resin plate after exposure, elongation at break and transparency of resin plate.

The water-developabale photosensitive resin composition of the present invention can freely take the form of wax or rubber having no fluidity, and liquid having low viscosity, etc.

The following Examples and Comparative Examples further illustrate the present invention in detail but are not to be construed to limit the scope thereof.

EXAMPLE 1

According to the manner described below, a copolymer (1) was prepared.

That is, a monomer composition of butadiene/Placcel FA-1, $CH_2=CHCOOC_2H_4OCO(CH_2)_5OH$ (manufactured by Daicel Chemical Industries, LTD., average molecular weight: 230)/methacrylic acid/divinylbenzene/methyl methacrylate (=73:7:7:1:12) (molar %), sodium lauryl sulfate as the emulsifier and potassium persulfate as the polymerization initiator were subjected to emulsion polymerization in a 20 liter autoclave. After the polymerization conversion % of the whole monomer reached 90%, a hydroxylamine sulfate salt was added in the amount of 0.2 parts by weight, based on 100 parts by weight of the monomer, to terminate the polymerization. Then, the reaction solution was heated and subjected to steam distillation under reduced pressure to remove a residual monomer.

The particle size of the resulting copolymer latex was measured. The average particle size was 72 nm. The resulting latex was subjected to salting-out using calcium chloride, washed and then dried to give a carboxyl group-containing particulate copolymer (1).

To 100 parts by weight of this copolymer (1), 30 parts by weight of lauryl methacrylate and 20 parts by weight of 1,6-hexanediol diacrylate as the photopolymerizable unsaturated monomer (2), 20 parts by weight of N-(3-dimethylaminopropyl)acrylamide as the amino group-containing compound (3), 3 parts by weight of 2,2-dimethoxyphenylacetophenone as the photopolymerization initiator (4), 30 parts by weight of a styrene-isoprene-styrene block copolymer (JSR SIS5000, manufactured by Japan Synthetic Rubber Co., Ltd.) as the block copolymer and 0.5 parts by weight of p-t-butylcatechol as the storage stabilizer were added. The mixture was stirred in a kneader adjusted at 50° C. for 50 minutes to give a photosensitive resin composition of the present invention. The resulting resin composition had the form of a transparent wax.

Evaluation:

The resulting photosensitive resin composition was applied on a polyester sheet to form a photosensitive resin layer having a thickness of 0.5 mm. Then the time required for the photosensitive resin layer to disappear was measured by brushing in a hot water at 30° C., using a developing device (JOW-A-4P type) manufactured by Nihon Denshi Seiki Co., Ltd.

In addition, the above resin plate was exposed to light for 6 minutes using an exposing device (JE-A3-SS type) manufactured by Nihon Denshi Seiki Co., Ltd., and then the tensile strength, elongation at break and resilience were measured according to JIS K6301.

As a result, the resulting composition was superior in water-developing properties and resilience, elongation at break, strength of resin plate and balance between characteristics. The above results are shown in Table 1.

EXAMPLE 2

According to the same manner as that described in Example 1 except for using butadiene/Placcel FM-2, $CH_2=C(CH_3)COOC_2H_4O\{CO(CH_2)_5O\}_2H$ (manufactured by Daicel Chemical Industries, LTD., average molecular weight: 358) /ω-carboxydi(pentamethylenecarboxy) oxyacrylate/ethylene glycol dimethacrylate/styrene (=81:7:5:1:6) (molar %) as the monomer components, the emulsion polymerization was conducted to give a particulate copolymer (1). Then, according to the same manner as that described in Example 1 except for using the above particulate copolymer (1), a composition of the present invention was produced.

The particle size of the resulting copolymer latex was measured to give 73 nm.

The resulting composition was superior in water-developing properties and resilience, elongation at break, strength of resin plate and balance between characteristics. The above results are shown in Table 1.

EXAMPLE 3

According to the same manner as that described in Example 1 except for using butadiene/Placcel FM-2/ methacrylic acid/ethylene glycol dimethacrylate/styrene (=72:14:7:1:6) (molar %) as the monomer components, the emulsion polymerization was conducted to give a particulate copolymer (1). The average particle size of the copolymer latex was 73 nm.

According to the same manner as that described in Example 1 except for adding 30 parts by weight of lauryl methacrylate and 20 parts by weight of 1,6-hexanediol diacrylate as the photopolymerizable unsaturated monomer (2), 20 parts by weight of N-(2-diethylaminoethyl) methacrylate as the amino group-containing compound (3), 3 parts by weight of 2,2-dimethoxyphenylacetophenone as the photopolymerization initiator (4), 30 parts by weight of a styrene-butadiene-styrene block copolymer (JSR TR2000, manufactured by Japan Synthetic Rubber Co., Ltd.) as the block copolymer and 0.5 parts by weight of p-t-butylcatechol as the storage stabilizer to 100 parts by weight of the particulate copolymer (1), a photosensitive resin composition of the present invention was prepared and it's evaluation was conducted.

The resulting composition was superior in water-developing properties and resilience, elongation at break, strength of resin plate and balance between characteristics. The above results are shown in Table 1.

EXAMPLE 4

According to the same manner as that described in Example 1 except for using butadiene/Placcel FM-3, $CH_2=C(CH_3)COOC_2H_4O\{CO(CH_2)_5O\}_3H$ (manufactured by Daicel Chemical Industries, LTD., average molecular weight: 472) /methacrylic acid/ω-carboxymono (pentamethylenecarboxy)oxyacrylate/divinylbenzene/ methyl methacrylate (=79:7:2:5:1:6) (molar %) as the monomer components, the emulsion polymerization was conducted to give a particulate copolymer (1). The average particle size of the copolymer latex was 72 nm.

According to the same manner as that described in Example 1 except for adding 30 parts by weight of lauryl methacrylate and 20 parts by weight of 1,6-hexanediol diacrylate as the photopolymerizable unsaturated monomer (2), 20 parts by weight of N-(2-diethylaminoethyl) methacrylate as the amino group-containing compound (3), 1 part by weight of 2,2-dimethoxyphenylacetophenone as the photopolymerization initiator (4) and 0.5 parts by weight of p-t-butylcatechol as the storage stabilizer to 100 parts by weight of the resulting particulate copolymer (1), a photosensitive resin composition of the present invention was prepared and it's evaluation was conducted.

The resulting composition was superior in water-developing properties and resilience, elongation at break, strength of resin plate and balance between characteristics.

The above results are shown in Table 1.

COMPARATIVE EXAMPLE 1

According to the same manner as that described in Example 1 except for using butadiene/divinylbenzene/methyl methacrylate/methacrylic acid (=80:1:12:7) (molar %) as the monomer components, the emulsion polymerization was conducted to give a particulate copolymer.

The average particle size of the resulting copolymer latex was 71 nm.

To 100 parts by weight of the resulting copolymer, 30 parts by weight of lauryl methacrylate, 20 parts by weight of 1,6-hexanediol diacrylate, 20 parts by weight of N-(3-dimethylaminopropyl)acrylamide, 3 parts by weight of 2,2-dimethoxyphenylacetophenone, 30 parts by weight of a styrene-isoprene-styrene block copolymer (SIS5000, manufactured by Japan Synthetic Rubber Co., Ltd.) and 0.5 parts by weight of p-t-butylcatechol were added, and the mixture was stirred in a kneader adjusted at 50° C. for 30 minutes to give a photosensitive resin composition of the present invention. The resulting resin composition had the form of a transparent wax.

According to the same manner as that described in Example 1, the resulting photosensitive resin composition was evaluated.

When using methacrylic acid in the preparation of the particulate copolymer, the resulting composition was inferior in water-developing properties and resilience.

The results are shown in Table 1. According to the same manner as that described in Example 1, photosensitive resin compositions were prepared and evaluated in Examples 5 and 6 and Comparative Example 2. The results are shown in Table 1.

TABLE 1

| Component | Photosensitive resin composition | | | Example No. 1 | 2 | 3 | 4 | 5 | 6 | Comparative Example No. 1 | 2 |
|---|---|---|---|---|---|---|---|---|---|---|---|
| 1 | Parts by weight Composition of copolymer (molar %) | | | 100 | 100 | 100 | 100 | 100 | 100 | 100 | 100 |
| | (a) | | Butadiene | 73 | 81 | 72 | 79 | 72 | 82 | 80 | 92 |
| | (b) | | FA-1*[1] | 7 | —*[7] | — | — | — | — | — | — |
| | | | FM-2*[2] | — | 7 | 14 | — | — | 5 | — | — |
| | | | FM-3*[3] | — | — | — | 7 | 14 | 5 | — | — |
| | (c) | • | Methacrylic acid | 7 | — | 7 | 2 | 7 | 7 | 7 | 7 |
| | | • | ω-Carboxydi (pentamethyl-enecarboxy) oxyacrylate*[4] | — | 5 | — | — | — | — | — | — |
| | | • | ω-Carboxymono (pentamethyl-enecarboxy) oxyacrylate | — | — | — | 5 | — | — | — | — |
| | (d) | • | Etylene glycol dimethacrylate | — | 1 | 1 | — | — | — | — | — |
| | | • | Divinylbenzene | 1 | — | — | 1 | 1 | 1 | 1 | 1 |
| | (e) | • | Methyl methacrylate | 12 | — | — | 6 | 6 | — | 12 | — |
| | | • | Styrene | — | 6 | 6 | — | — | — | — | — |
| 2 | (Parts by weight) | | | | | | | | | | |
| | | • | Lauryl methacrylate | 30 | 30 | 30 | 30 | 30 | 30 | 30 | 30 |
| | | • | 1,6-Hexanediol diacrylate | 20 | 20 | 20 | 20 | 20 | 20 | 20 | 20 |
| 3 | (Parts by weight) | | | | | | | | | | |
| | | • | N-(3-dimethylaminopropyl)acrylamide | 20 | 20 | — | — | 10 | 20 | 20 | 20 |
| | | • | N-(2-diethylaminoethyl)methacrylate | — | — | 20 | 20 | — | — | — | — |
| 4 | (Parts by weight) | | | | | | | | | | |
| | | • | 2,2-Dimethoxyphenylacetophenone | 3.0 | 3.0 | 3.0 | 1.0 | 3.0 | 3.0 | 3.0 | 3.0 |
| — | (Parts by weight) | | | | | | | | | | |
| | | • | Styrene-butadiene-styrene block copoly- | — | — | 30 | — | — | — | — | — |

TABLE 1-continued

| Component | Photosensitive resin composition | Example No. 1 | 2 | 3 | 4 | 5 | 6 | Comparative Example No. 1 | 2 |
|---|---|---|---|---|---|---|---|---|---|
| | mer*5) | | | | | | | | |
| | • Styrene-isoprene-styrene block copolymer*6) | 30 | 30 | — | — | — | 30 | 30 | 30 |
| | • p-t-Butylcatechol | 0.5 | 0.5 | 0.5 | 0.5 | 0.5 | 0.5 | 0.5 | 0.5 |
| (Evaluation item) | | | | | | | | | |
| | Washout time (second) | 190 | 160 | 210 | 200 | 210 | 210 | 270 | 250 |
| | Tensile strength (kgf/cm²) | 34 | 35 | 31 | 35 | 32 | 32 | 26 | 25 |
| | Elongation at break (%) | 160 | 170 | 180 | 170 | 180 | 180 | 120 | 150 |
| | Resilience (%) | 35 | 36 | 38 | 36 | 38 | 37 | 26 | 28 |

*1)Placcel FA-1, $CH_2$=CHCOO$C_2H_4$OCO$(CH_2)_5$OH manufactured by Daicel Chemical Industries, LTD., average molecular weight: 230
*2)Placcel FM-2, $CH_2$=C($CH_3$)COO$C_2H_4$O{CO$(CH_2)_5$O}$_2$H manufactured by Daicel Chemical Industries, LTD., average molecular weight: 358
*3)Placcel FM-3, $CH_2$=C($CH_3$)COO$C_2H_4$O{CO$(CH_2)_5$O}$_3$H manufactured by Daicel Chemical Industries, LTD., average molecular weight: 472
*4)$CH_2$=CHCOO—($C_5H_{10}$COO)$_2$—H
*5)JSR TR2000 manufactured by Japan Synthetic Rubber Co., Ltd.
*6)JSR SIS5000 manufactured by Japan Synthetic Rubber Co., Ltd.
*7)Not added

What is claimed is:

1. A water-developable photosensitive resin composition, comprising:

(1) particles of a copolymer formed by polymerizing a monomer mixture comprising:
  (a) 10 to 95 molar % of an aliphatic conjugated diene monomer,
  (b) 0.1 to 30 molar % of a monomer represented by the following general formula (I):

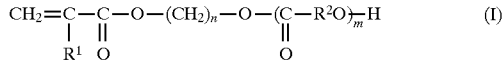

wherein $R^1$ is a hydrogen atom or a methyl group, $R^2$ is an alkylene group having 3 to 20 carbon atoms, n is an integer of 2 to 6, and m is an integer of 1 to 20,
  (c) 0.1 to 30 molar % of an unsaturated monomer having at least one group selected from a carboxyl group, a phosphoric group, a phosphate group and a sulfonic group, and
  (d) 0.1 to 20 molar % of a monomer having at least two groups capable of addition-polymerizing, the total amount of components (a), (b), (c) and (d) being 100 molar %;
(2) a photopolymerizable unsaturated monomer;
(3) an amino group-containing compound; and
(4) a photopolymerization initiator.

2. A water-developable photosensitive resin composition, comprising:

(1) 100 parts by weight of particles of a copolymer formed by polymerizing a monomer mixture comprising:
  (a) 10 to 95 molar % of an aliphatic conjugated diene monomer,
  (b) 0.1 to 30 molar % of a monomer represented by the following general formula (I):

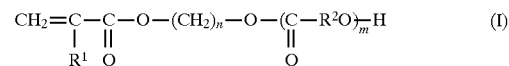

wherein $R^1$ is a hydrogen atom or a methyl group, $R^2$ is an alkylene group having 3 to 20 carbon atoms, n is an integer of 2 to 6, and m is an integer of 1 to 20,
  (c) 0.1 to 30 molar % of an unsaturated monomer having at least one group selected from a carboxyl group, a phosphoric group, a phosphate group and a sulfonic group, and
  (d) 0.1 to 20 molar % of a monomer having at least two groups capable of addition-polymerizing, the total amount of components (a), (b), (c) and (d) being 100 molar %;
(2) 5 to 1,000 parts by weight of a photopolymerizable unsaturated monomer;
(3) 2 to 50 parts by weight of an amino group-containing compound; and
(4) 0.1 to 20 parts by weight of a photopolymerization initiator.

3. The water-developable photosensitive resin composition according to claim 1, further comprising a block copolymer of a non-elastomeric polymer block having a glass transition point of not less than 20° C. and an elastomeric polymer block having a glass transition point of not more than 10° C.

4. The water-developable photosensitive resin composition according to claim 2, further comprising a block copolymer of a non-elastomeric polymer block having a glass transition point of not less than 20° C. and an elastomeric polymer block having a glass transition point of not more than 10° C. in an amount of 0.1 to 100 parts by weight, based on 100 parts by weight of the copolymer particles.

5. The water-developable photosensitive resin composition according to any one of claims 1 to 4, wherein $R^2$ is an alkylene group having 3 to 7 carbon atoms, n is an integer of 2 to 4, and m is an integer of 1 to 5.

6. A flexographic plate with a photosensitive layer formed from a water-developable photosensitive resin composition, comprising:

(1) particles of a copolymer obtained by polymerizing a monomer mixture comprising:
  (a) 10 to 95 molar % of an aliphatic conjugated diene monomer,
  (b) 0.1 to 30 molar t of a monomer represented by the following general formula (I):

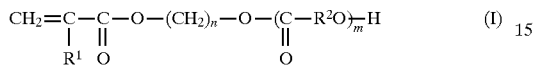

wherein $R^1$ is a hydrogen atom or a methyl group, $R^2$ is an alkylene group having 3 to 20 carbon atoms, n is an integer of 2 to 6, and m is an integer of 1 to 20,
  (c) 0.1 to 30 molar % of an unsaturated monomer having at least one group selected from a carboxyl group, a phosphoric group, a phosphate group and a sulfonic group, and
  (d) 0.1 to 20 molar % of a monomer having at least two groups capable of addition-polymerizing, the total amount of components (a), (b), (c) and (d) being 100 molar %;

(2) a photopolymerizable unsaturated monomer;

(3) an amino group-containing compound; and (4) a photopolymerization initiator.

7. A flexographic plate with a photosensitive layer formed from a water-developable photosensitive resin composition, comprising:

(1) 100 parts by weight of particles of a copolymer formed by polymerizing a monomer mixture comprising:
  (a) 10 to 95 molar % of an aliphatic conjugated diene monomer,
  (b) 0.1 to 30 molar % of a monomer represented by the following general formula (I):

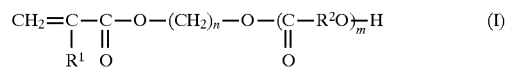

wherein $R^1$ is a hydrogen atom or a methyl group, $R^2$ is an alkylene group having 3 to 20 carbon atoms, n is an integer of 2 to 6, and m is an integer of 1 to 20,
  (c) 0.1 to 30 molar % of an unsaturated monomer having at least one group selected from a carboxyl group, a phosphoric group, a phosphate group and a sulfonic group, and
  (d) 0.1 to 20 molar % of a monomer having at least two groups capable of addition-polymerizing, the total amount of components (a), (b), (c) and (d) being 100 molar %;

(2) 5 to 1,000 parts by weight of a photopolymerizable unsaturated monomer;

(3) 2 to 50 parts by weight of an amino group-containing compound; and (4) 0.1 to 20 parts by weight of a photopolymerization initiator.

8. A flexographic plate of claim 6, in which the water-developable photosensitive resin composition further comprises a block copolymer of a non-elastomeric polymer block having a glass transition point of not less than 20° C. and an elastomeric polymer block having a glass transition point of not more than 10° C.

9. A flexographic plate of claim 7, in which the water-developable photosensitive resin composition further comprises a block copolymer of a non-elastomeric polymer block having a glass transition point of not less than 20° C. and an elastomeric polymer block having a glass transition point of not more than 10° C. in an amount of 0.1 to 100 parts by weight, based on 100 parts by weight of the copolymer particles.

10. A flexographic plate of any one of claims 6 to 9, in which $R^2$ is an alkylene group having 3 to 7 carbon atoms, n is an integer of 2 to 4, and m is an integer of 1 to 5.

* * * * *